United States Patent
Cha et al.

(10) Patent No.: US 7,420,429 B2
(45) Date of Patent: Sep. 2, 2008

(54) SOURCE COUPLED DIFFERENTIAL COMPLEMENTARY COLPITTS OSCILLATOR

(75) Inventors: Choong-Yul Cha, Yongin-si (KR); Hoon Tae Kim, Suwon-si (KR); Chun Deok Suh, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 105 days.

(21) Appl. No.: 11/600,732

(22) Filed: Nov. 17, 2006

(65) Prior Publication Data

US 2007/0257742 A1 Nov. 8, 2007

(30) Foreign Application Priority Data

May 2, 2006 (KR) ...................... 10-2006-0039637

(51) Int. Cl.
*H03B 5/12* (2006.01)

(52) U.S. Cl. ...................... 331/46; 331/48; 331/108 A; 331/117 FE; 331/177 V

(58) Field of Classification Search .................. 331/46, 331/48, 56, 108 A, 117 R, 117 FE, 117 D, 331/177 R, 177 V
See application file for complete search history.

(56) References Cited

U.S. PATENT DOCUMENTS

| 5,396,195 | A | 3/1995 | Gabara |
| 6,198,360 | B1 | 3/2001 | Henrion |
| 6,249,190 | B1 | 6/2001 | Rozenblit et al. |
| 6,456,167 | B1 | 9/2002 | Huang |
| 6,867,658 | B1 | 3/2005 | Sibrai |
| 7,002,423 | B1 | 2/2006 | Drakhlis et al. |
| 7,123,112 | B2 * | 10/2006 | Kang et al. ............ 331/117 FE |
| 2005/0046502 | A1 | 3/2005 | Singh et al. |
| 2006/0033587 | A1 | 2/2006 | Cabanillas |

FOREIGN PATENT DOCUMENTS

| JP | 07-202565 A | 8/1995 |
| JP | 2005-269310 A | 9/2005 |
| KR | 10-0399585 B1 | 9/2003 |

OTHER PUBLICATIONS

Cha C-Y et al: "A complementary Colpitts Oscillator in CMOS Technology", IEEE Transactions on Microwave Theory and Techniques, IEEE Service Center, Piscataway, NJ, vol. 53, No. 3, Part 1, Mar. 2005, pp. 881-887, ISSN: 0018-9480.
Zirath H et al: "MMIC-oscillator designs for ultra low phase noise", Compound Semiconductor Integrated Circuit Symposium, 2005, CSIC '05, IEEE Palm Springs, CA, USA, Oct. 2-Nov. 2005, Piscataway, NJ, USA, IEEE pp. 204-207, ISBN: 0-7803-9250-7.
Zirath H et al: "A x2 coupled colpitt VCO 1-8 with ultra low phase noise", Compound Semiconductor Integrated Circuit Symposium, 2004. IEEE Monterey, CA, USA, Oct. 24-27, 2004, Piscataway, NJ, pp. 155-158, ISBN: 0-7803-8616-7.

* cited by examiner

*Primary Examiner*—David Mis
(74) *Attorney, Agent, or Firm*—Sughrue Mion, PLLC

(57) ABSTRACT

A source coupled differential complementary Colpitts oscillator is described, which enables a differential oscillation and also can improve phase noise performance by source-coupling a complementary Colpitts oscillator using an inductor. A differential complementary Colpitts oscillator includes: a plurality of complementary Colpitts oscillators and a source coupler which couples a source node of the plurality of complementary Colpitts oscillators, enables the Colpitts oscillators to differentially oscillate.

11 Claims, 6 Drawing Sheets

SOURCE COUPLED DIFFERENTIAL COMPLEMENTARY COLPITTS OSCILLATOR

CROSS-REFERENCE TO RELATED PATENT APPLICATION

This application claims the benefit of Korean Patent Application No. 10-2006-0039637, filed on May 2, 2006, in the Korean Intellectual Property Office, the disclosure of which is incorporated herein by reference.

BACKGROUND OF THE INVENTION

1. Field of the Invention

The present invention relates to a source coupled differential complementary Colpitts oscillator which enables a differential oscillation and also can improve phase noise performance by source-coupling a complementary Colpitts oscillator using an inductor.

2. Description of the Related Art

Generally, a complementary Colpitts oscillator using an N-channel metal-oxide semiconductor (NMOS) and P-channel metal-oxide semiconductor (PMOS) enables a self-biasing. Accordingly, the complementary Colpitts oscillator has a simple circuit structure, and the noise performance of the complementary Colpitts oscillator is superior to the negative-Gm differential oscillator.

However, the complementary Colpitts oscillator performs only a single-ended oscillation. Accordingly, the complementary Colpitts oscillator may not be applied to an integrated circuit which requires a differential oscillation. A Colpitts oscillator for a differential oscillation has been developed which induces differential oscillation by combining a plurality of complementary Colpitts oscillators. In this instance, the oscillations are output from a plurality of complementary Colpitts oscillators.

FIG. 1 is a diagram illustrating a circuit of a Colpitts oscillator for a differential oscillation according to a related art.

As illustrated in FIG. 1, the related art Colpitts oscillator for differential oscillation combines two complementary Colpitts oscillators using an NMOS and a PMOS semiconductors with a cross coupled transistor pair, thereby enabling the differential oscillation.

Specifically, the Colpitts oscillator for the differential oscillation of FIG. 1 cross combines an N-metal-oxide semiconductor field-effect transistor (N-MOSFET) and a P-metal-oxide semiconductor field-effect transistor (P-MOSFET) with an inverse complementary Colpitts oscillator, thereby inducing the differential oscillation. In this instance, the N-MOSFET and the P-MOSFET constitute a complementary Colpitts oscillator.

However, in the case of the related art Colpitts oscillator for differential oscillation, a number of inductors Ltank is increased to match the number of combined complementary Colpitts oscillators. Accordingly, a layout of the integrated circuit is expanded.

Also, in the case of the related art Colpitts oscillator for differential oscillation, a MOSFET operates in a linear mode in a comparatively greater oscillation swing. Accordingly, the quadrature (Q)-factor of a linkcontrol(LC) Tank circuit is reduced, and the phase noise performance deteriorates.

Therefore, a differential complementary Colpitts oscillator which enables a differential oscillation with low noise is highly needed.

BRIEF SUMMARY OF THE INVENTION

The present invention provides a source coupled differential complementary Colpitts oscillator which can combine a plurality of complementary Colpitts oscillators and induce a differential oscillation, and thereby overcome a limit of a single-ended oscillation for an individual complementary Colpitts oscillator.

The present invention also provides a source coupled differential complementary Colpitts oscillator which can, via a source coupling inductor, couple each source node of a MOSFET constituting a complementary Colpitts oscillator, and thereby improve phase noise performance.

The present invention also provides a source coupled differential complementary Colpitts oscillator which may integrate a plurality of Ltanks of a complementary Colpitts oscillator into one transformer, and thereby reduce a layout size.

According to an aspect of the present invention, there is provided a differential complementary Colpitts oscillator including: a plurality of complementary Colpitts oscillators; and a source coupler which couples a source node of the plurality of complementary Colpitts oscillators, and enables the Colpitts oscillators to differentially oscillate.

According to another aspect of the present invention, there is provided a differential complementary Colpitts oscillator including: a plurality of complementary Colpitts oscillators, each of the complementary Colpitts oscillators including a transformer; and a source coupler which couples a source node of the plurality of complementary Colpitts oscillators, and enables the Colpitts oscillators to differentially oscillate.

BRIEF DESCRIPTION OF THE DRAWINGS

The above and/or other aspects of the present invention will become apparent and more readily appreciated from the following detailed description of exemplary embodiments, taken in conjunction with the accompanying drawings of which.

DETAILED DESCRIPTION OF EXEMPLARY EMBODIMENTS

Figure 1:
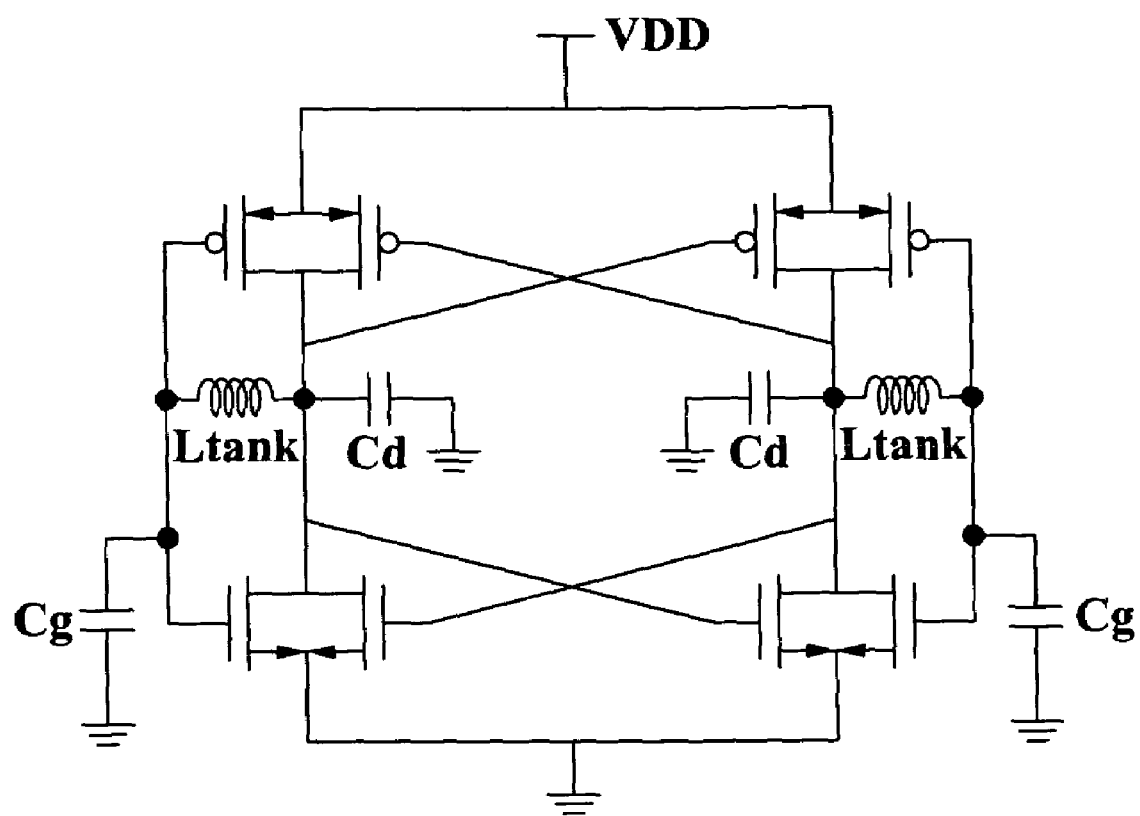
FIG. 1 is a diagram illustrating a circuit of a Colpitts oscillator for a differential oscillation according to a related art.

Reference will now be made in detail to exemplary embodiments of the present invention, examples of which are illustrated in the accompanying drawings, wherein like reference numerals refer to like elements throughout. The exemplary embodiments are described below in order to explain the present invention by referring to the figures.

Figure 2A:
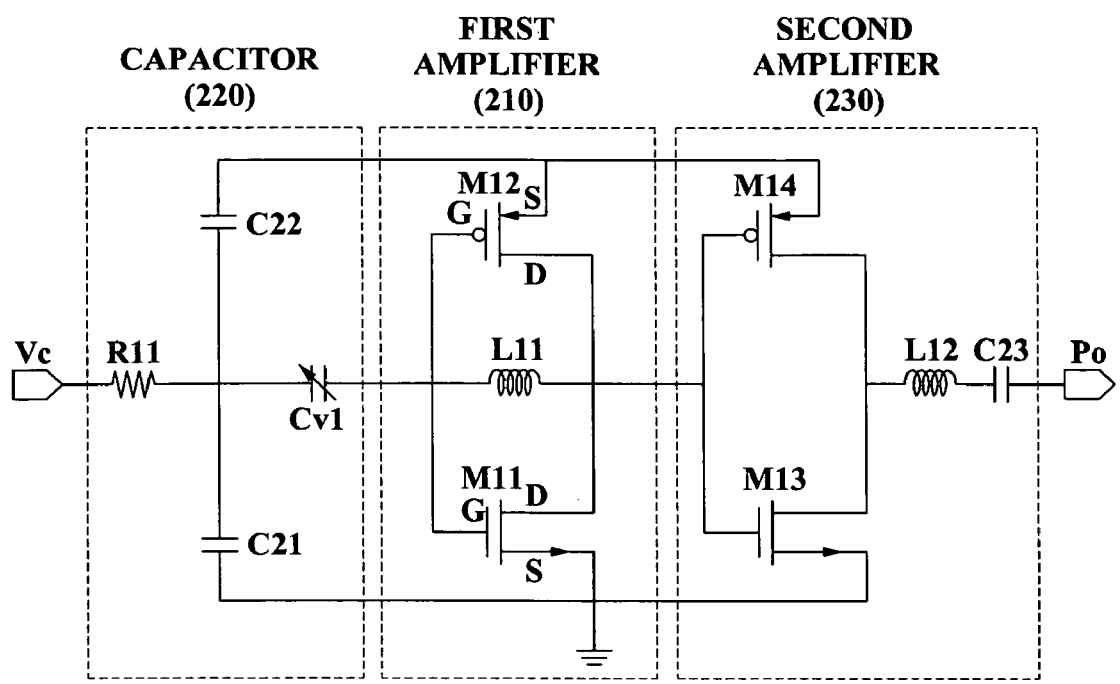
FIGS. 2A and 2B are diagrams illustrating a complementary Colpitts oscillator according to an exemplary embodiment of the present invention.
Figure 2B:
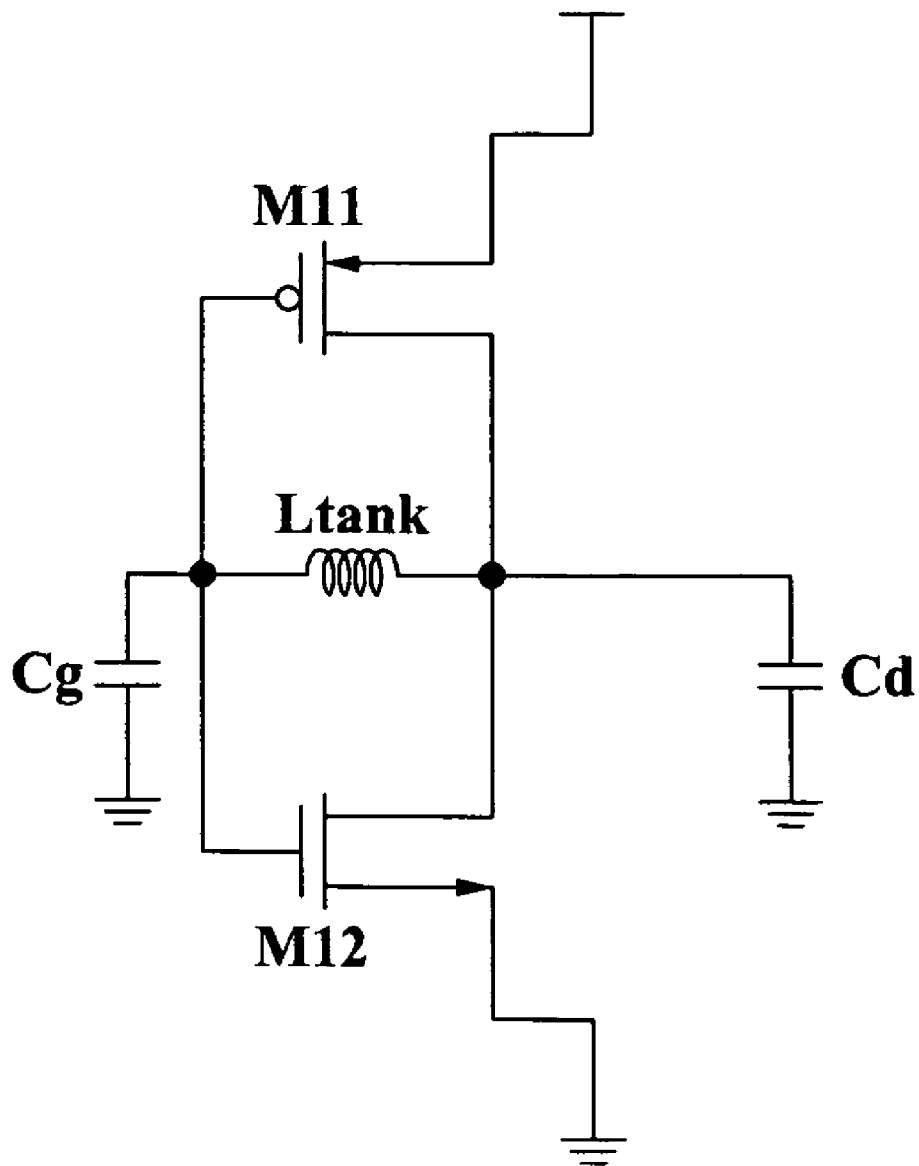

FIGS. 2A and 2B are diagrams illustrating a complementary Colpitts oscillator according to an exemplary embodiment of the present invention.

FIG. 2A illustrates a circuit of the complementary Colpitts oscillator.

As illustrated in FIG. 2A, the complementary Colpitts oscillator 200 includes a first amplifier 210, a capacitor 220, and a second amplifier 230.

The capacitor 220 includes a variable capacitor Cv1. In this instance, a total electric capacitance is changed by an input voltage Vc, and the variable capacitor Cv1 changes an oscillation frequency. Also, the capacitor 220 includes a resistance R11 for a signal cut-off, and capacitors C21 and C22, which are connected to the resistance R11 in parallel. The variable capacitor Cv1 and the resistance R11 are connected in series, and the variable capacitor Cv1 and the capacitors C21 and C22 are connected in parallel. Also, the variable capacitor Cv1 changes the oscillation frequency by changing the capacitance of a field-effect transistor (FET) based on the input voltage.

The first amplifier 210 includes complementary metal-oxide semiconductor field-effect transistors (MOSFETs) M11 and M12. In this instance, the complementary MOSFETs M11 and M12 provide a capacitance which is used in operation with an inductor L11 when determining the oscillation frequency. Also, the complementary MOSFETs M11 and M12 generate a negative impedance. Gates of the complementary MOSFETs M11 and M12 and one end of the variable capacitor Cv1 of the capacitor 220 are connected together, and thereby share a bias current. Also, the first amplifier 210 connects a drain and a gate of the complementary MOSFETs M11 and M12 through a parallel inductor L11. Accordingly, the complementary MOSFETs M11 and M12 form a diode type structure in a direct current (DC). In this instance, the MOSFET M11 is an N type MOSFET, and the MOSFET M12 is a P type MOSFET.

The second amplifier 230 buffers/amplifies the oscillation frequency which is generated from the first amplifier 210, and outputs the oscillation frequency to an output stage Po. The second amplifier 230 includes complementary MOSFETs M13 and M14 whose gates are connected to each of the drains of the complementary MOSFETs M11 and M12 of the first amplifier 210. Also, the drains of the complementary MOSFETs M13 and M14 are connected to one end of an inductor L12. The complementary MOSFETs M13 and M14 share the bias current, and thereby may embody an inverter amplifier. In this instance, the complementary MOSFET M13 is an N type MOSFET, and the other complementary MOSFET M14 is a P type MOSFET. The inductor L12 may connect to a capacitor C23 and the output stage Po in series.

A side of the capacitor C22 that is not connected to the resistance R11, and sources of the complementary MOSFETs M12 and M14, may be connected together with a source coupling inductor which will be described below. A side of the capacitor C21 that is not connected to the resistance R11 connects sources of the complementary MOSFETs M11 and M13 and may be connected together with a ground.

An operation of the complementary Colpitts oscillator 200 which is configured as above will be described by referring to FIG. 2B.

FIG. 2B illustrates the circuit of the complementary Colpitts oscillator which is simply embodied by using the first amplifier 210.

The complementary Colpitts oscillator 200 may embody an oscillator by using the first amplifier 210. In this case, the complementary Colpitts oscillator 200 may embody a tank circuit Ltank by using the capacitance and the inductor L11. In this instance, the capacitance is connected to gates of the complementary MOSFETs M11 and M12 of the first amplifier 210 which is combined in a diode configuration. Also, the inductor L11 is connected to the complementary MOSFETs M11 and M12 in parallel. Accordingly, the complementary Colpitts oscillator 200 may reduce a number of required passive elements.

The electric capacity of a capacitor Cg which is connected to gates of the MOSFETs M11 and M12 is controlled by the input voltage Vc. Accordingly, the oscillation frequency output by the capacitor Cg may be also controlled.

A capacitor Cd which is connected to drains of the MOSFETs M11 and M12 may be used for an output impedance control and a DC cutoff.

The differential complementary Colpitts oscillator of the present invention combines a plurality of complementary Colpitts oscillators 200 which are capable of only a single-ended output. Accordingly, the differential complementary Colpitts oscillator 200 enables a differential output. Specifically, the differential complementary Colpitts oscillator of the present invention combines the plurality of complementary Colpitts oscillators and couples a source node of the combined complementary Colpitts oscillators using a source coupling inductor. Accordingly, the differential complementary Colpitts oscillator may improve phase noise performance.

Figure 3:
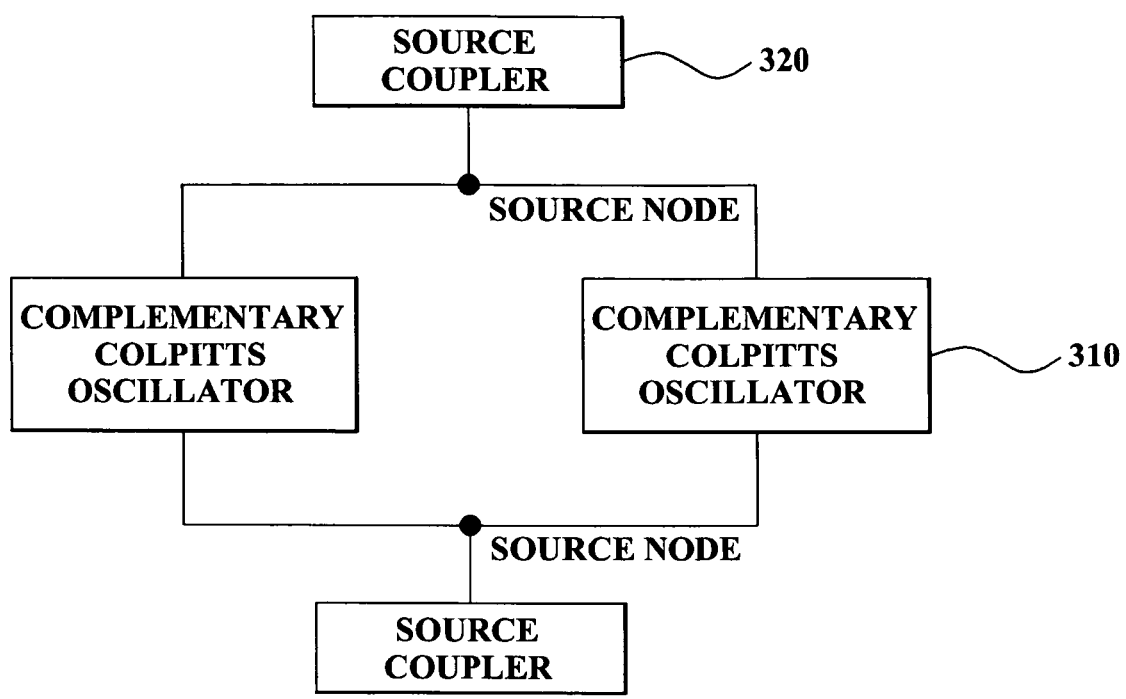
FIG. 3 is a diagram illustrating a configuration of a differential complementary Colpitts oscillator according to an exemplary embodiment of the present invention.

FIG. 3 is a diagram illustrating a configuration of a differential complementary Colpitts oscillator according to an exemplary embodiment of the present invention.

The differential complementary Colpitts oscillator 300 includes a complementary Colpitts oscillator 310 and a source coupler 320.

As shown in FIG. 2A, the complementary Colpitts oscillator 310 includes a capacitor 220, a first amplifier 210, and a second amplifier 230. Accordingly, the complementary Colpitts oscillator 310 can generate a low phase noise and a large output in comparison with a power consumption. Also, the complementary Colpitts oscillator 310 reduces the required passive elements to a minimum through an improvement in the circuit configuration. Accordingly, the complementary Colpitts oscillator 310 prevents performance deterioration due to parasitic components of the passive elements.

The differential complementary Colpitts oscillator 300 of an exemplary embodiment of the present invention combines a plurality of the complementary Colpitts oscillators 310, thereby overcoming the limit of a single-ended oscillation in the related art and enabling a differential oscillation.

The source coupler 320 couples a source node of the plurality of complementary Colpitts oscillators, and enables the Colpitts oscillators to differentially oscillate. Specifically, the source coupler 320 combines the complementary Colpitts oscillator with a cross coupled transistor pair, and thereby compensates for and improves any performance degradation of phase noise caused in the related art.

Elements which can be used as the source coupler 320 may be a resistor, a current source, a link control (LC), or a radio link control (RLC), etc. The present particular exemplary embodiment illustrates a coupling of the source node using a source coupling inductor.

The source coupler 320 couples the source node. Accordingly, the differential complementary Colpitts oscillator 300 of the present invention may prevent the quadrature (Q)-factor of an LC Tank circuit from being reduced and the phase noise performance from deteriorating due to a MOSFET. In this instance, the MOSFET operates in a linear mode in a comparatively greater oscillation swing.

Moreover, the differential complementary Colpitts oscillator 300 according to the present exemplary embodiment enables a differential oscillation by combining the plurality of the complementary Colpitts oscillators. Also, the differential complementary Colpitts oscillator 300 enables improvement of the phase noise performance by coupling the source node of the plurality of complementary Colpitts oscillators.

Figure 4:
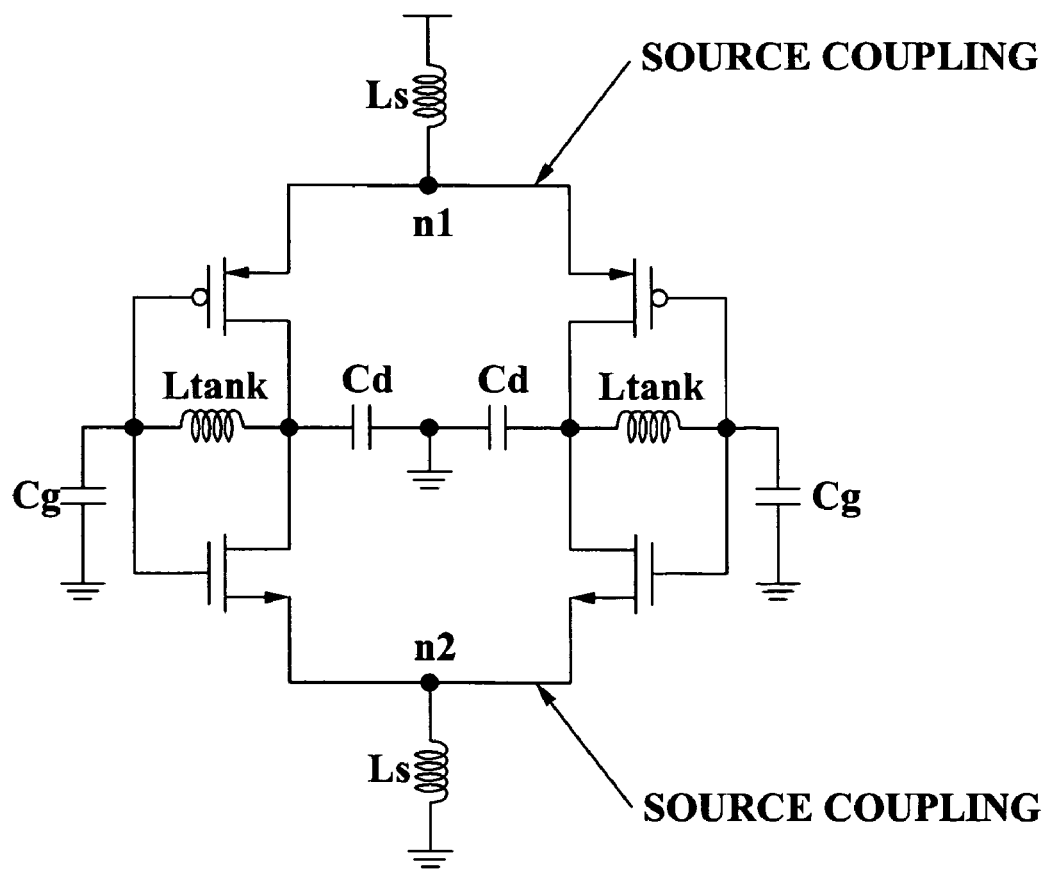
FIG. 4 is a circuit diagram of a differential complementary Colpitts oscillator according to an exemplary embodiment of the present invention.

FIG. 4 is a circuit diagram of a differential complementary Colpitts oscillator according to an exemplary embodiment of the present invention.

As illustrated in FIG. 4, the differential complementary Colpitts oscillator 300 according to an exemplary embodiment of the present invention combines a plurality of the complementary Colpitts oscillators 310 with reference to FIG. 2B. Also, the differential complementary Colpitts oscillator 300 connects each of the sources, i.e., each source of a plurality of MOSFETs constituting a complementary Colpitts oscillator 310, by using a source coupling inductor Ls.

When combining the plurality of the complementary Colpitts oscillators 310, the differential complementary Colpitts oscillator 300 combines each complementary Colpitts oscillator 310 to be symmetrical on the basis of a capacitor Cd of an output stage. Also, the differential complementary Colpitts oscillator 300 enables each complementary Colpitts oscillator 310 to generate an oscillation, thereby outputting a differential oscillation.

In order to compensate for phase noise performance deterioration due to an individual oscillation of the complementary Colpitts oscillator 310, the differential complementary Colpitts oscillator 300 couples a source node of the complementary Colpitts oscillator 310 by using a source coupler 320, i.e., the source coupling inductor Ls.

The differential complementary Colpitts oscillator 300 in FIG. 4 combines two complementary Colpitts oscillators 310 so that a capacitor Cg, an Ltank, and a capacitor Cd are connected in series. Also, the differential complementary Colpitts oscillator 300 couples the source nodes n1 and n2 by using the source coupling inductor Ls.

Due to the coupling by using the source coupling inductor Ls, the differential complementary Colpitts oscillator 300 may compensate for and improve any performance degradation of phase noise. In this instance, the performance degradation of the phase noise is caused by a reduction of a Q-factor of an LC Tank circuit. The reduction of the Q-factor of the LC Tank circuit is caused by a MOSFET which is operated in a linear mode in a comparatively greater oscillation swing.

In FIG. 4, use of the source coupling inductor Ls as the source coupler 320 is illustrated to be confined. However, the source coupler couples the source nodes n1 and n2 by using any one of a resistor, a current source, an LC, and an RLC.

Thus, according to an exemplary embodiment of the present invention, a differential oscillation is induced by combining a plurality of the complementary Colpitts oscillators 310. Accordingly, the limit of a single-ended oscillation by each of the plurality of complementary Colpitts oscillators 310 may be overcome. The phase noise performance is also notably improved by coupling each source node of a MOSFET, constituting the complementary Colpitts oscillator 310, via the source coupling inductor.

According to another exemplary embodiment of the present invention, the differential complementary Colpitts oscillator combines a plurality of complementary Colpitts oscillators while including a transformer. Accordingly, the differential complementary Colpitts oscillator improves phase noise performance and induces differential oscillation. The differential complementary Colpitts oscillator including the transformer is embodied by replacing each Ltank, constituting the combined complementary Colpitts oscillators, with one transformer. Accordingly, the layout of the integrated circuit may be notably reduced.

Figure 5:
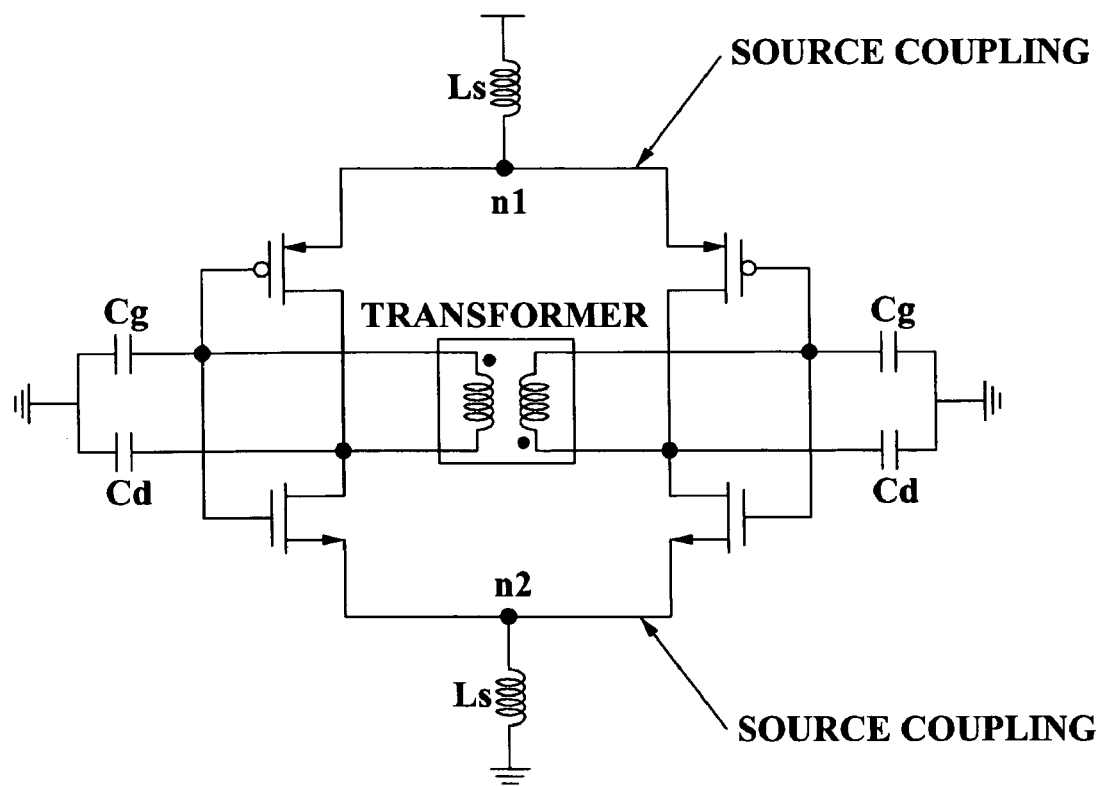
FIG. 5 is a circuit diagram of a differential complementary Colpitts oscillator according to another exemplary embodiment of the present invention.

FIG. 5 is a circuit diagram of a differential complementary Colpitts oscillator according to another exemplary embodiment of the present invention.

As shown in FIG. 3, a complementary Colpitts oscillator 310, constituting a differential complementary Colpitts oscillator 300, includes an Ltank which parallel connects a gate and a drain of an N-MOSFET or a gate and a drain of a P-MOSFET. The differential complementary Colpitts oscillator 300 according to the present exemplary embodiment replaces the Ltank of each of a plurality of the complementary Colpitts oscillators 310 combined with a transformer which may be designed to have a small size. Accordingly, the layout of the entire circuit may be reduced.

When a predetermined input signal is confirmed to be at both ends of a primary winding, the transformer generates an output signal with a level in proportion to the number of coils which are wound with a secondary winding according to electromagnetic induction theory. In this instance, a winding through which the input signal is input or output performs an identical function with the Itank of the complementary Colpitts oscillator 310. Accordingly, the differential complementary Colpitts oscillator 300 includes the transformer which replaces the Ltank of the complementary Colpitts oscillator 310, thereby reducing the number of elements and effectively outputting a differential oscillation.

FIG. 5 illustrates the differential complementary Colpitts oscillator 300 which connects the gates and drains of the N-MOSFET and P-MOSFET in parallel, constituting the complementary Colpitts oscillator 310, together with the transformer. The differential complementary Colpitts oscillator 300 in FIG. 5 also connects a capacitor Cg and a capacitor Cd in series to opposite ends of the winding of the transformer. In the same way as the differential complementary Colpitts oscillator 300 of FIG. 4, the differential complementary Colpitts oscillator 300 couples source nodes n1 and n2 by using a source coupling inductor Ls.

Due to the coupling using the source coupling inductor Ls, the differential complementary Colpitts oscillator 300 may compensate for and improve a performance degradation of phase noise. In this instance, the performance degradation of phase noise is caused by a reduction of a Q-factor of an LC Tank circuit. The reduction of the Q-factor of the LC Tank circuit is caused by a MOSFET which is operated in a linear mode in a comparatively greater oscillation swing.

As described above, a source coupler 320 may couple the source nodes n1 and n2 by using any one of a resistor, a current source, an LC, and an RLC other than the source coupling inductor Ls.

Thus, a differential oscillation is induced by combining the plurality of the complementary Colpitts oscillators 310. Accordingly, the limit of a single-ended oscillation by each of the plurality of complementary Colpitts oscillators 310 may be overcome. Also, the phase noise performance is notably improved by coupling each source node of the MOSFET, constituting the complementary Colpitts oscillator 310, via the source coupling inductor.

More particularly, the plurality of Ltanks of the combined complementary Colpitts oscillators 310 may be integrated into one transformer, thereby notably reducing the layout size.

Thus, a source coupled differential complementary Colpitts oscillator is provided, which can combine a plurality of complementary Colpitts oscillators and induce a differential oscillation, thereby overcoming the limit of a single-ended oscillation by an individual complementary Colpitts oscillator.

Also, a source coupled differential complementary Colpitts oscillator is provided, which can, via a source coupling inductor, couple each source node of a MOSFET constituting a complementary Colpitts oscillator, thereby improving phase noise performance.

Also, a source coupled differential complementary Colpitts oscillator is provided, which may integrate a plurality of Ltanks of a complementary Colpitts oscillator into one transformer, thereby reducing the layout size.

A differential complementary Colpitts oscillator enabling a differential oscillation with low noise may be applicable to various electronic circuits such as a complementary metal-oxide semiconductor (CMOS) transceiver, a voltage-controlled oscillator (VCO)/phase locked loop (PLL) integrated circuit, clock generation for optical communications, a high-electron-mobility transistor (HEMT), and a bipolar, etc.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A differential complementary Colpitts oscillator comprising:
    a plurality of complementary Colpitts oscillators; and
    a source coupler which couples a source node of the plurality of complementary Colpitts oscillators, and enables the Colpitts oscillators to differentially oscillate.

2. The oscillator of claim 1, wherein the source coupler couples the source node using a source coupling inductor.

3. The oscillator of claim 2, wherein the source coupling inductor compensates performance degradation of a phase noise caused in an oscillation swing.

4. The oscillator of claim 1, wherein the source coupler couples the source node using one of a resistor, a current source, a link control (LC), and a radio link control (RLC).

5. The oscillator of claim 1, wherein a complementary Colpitts oscillator is configured using a N-metal-oxide semiconductor field-effect transistor (N-MOSFET) and a P-metal-oxide semiconductor field-effect transistor (P-MOSFET).

6. The oscillator of claim 5, wherein the complementary Colpitts oscillator further comprises a first amplifier which connects a gate of the N-MOSFET and a gate of the P-MOSFET, connects a drain of the N-MOSFET and a drain of the P-MOSFET, and parallel connects the gates and the drains of the N-MOSFET and the P-MOSFET using an inductor.

7. The oscillator of claim 6, wherein the complementary Colpitts oscillator further comprises:
    a capacitor which inputs an oscillation frequency, which is changed according to an input voltage, into the gates of the N-MOSFET and the P-MOSFET; and
    a second amplifier which amplifies a frequency which is oscillated from the first amplifier, and outputs the frequency.

8. A differential complementary Colpitts oscillator comprising:
    a plurality of complementary Colpitts oscillators, each of the Colpitts oscillators comprising a transformer; and
    a source coupler which couples source nodes of the plurality of complementary Colpitts oscillators, and enables the Colpitts oscillators to differentially oscillate.

9. The oscillator of claim 8, wherein the source coupler couples the source node using a source coupling inductor.

10. The oscillator of claim 9, wherein the source coupling inductor compensates performance degradation of a phase noise caused in an oscillation swing.

11. The oscillator of claim 8, wherein the source coupler couples the source nodes using one of a resistor, a current source, a link control (LC), and a radio link control (RLC).

* * * * *